(12) United States Patent
Chiu

(10) Patent No.: US 6,967,400 B2
(45) Date of Patent: Nov. 22, 2005

(54) IC CHIP PACKAGE

(76) Inventor: Wen-Wen Chiu, No. 15, Alley 16, Lane 576, Sec. 1, Kuang Fu Rd., Tung Zone, Hsin Chiu City (TW)

(*) Notice: Subject to any disclaimer, the term of this patent is extended or adjusted under 35 U.S.C. 154(b) by 106 days.

(21) Appl. No.: 10/764,457

(22) Filed: Jan. 27, 2004

(65) Prior Publication Data

US 2004/0183169 A1    Sep. 23, 2004

Related U.S. Application Data

(63) Continuation of application No. 10/033,982, filed on Jan. 3, 2002, now abandoned.

(30) Foreign Application Priority Data

Jan. 4, 2001  (TW) .............................. 90100977 A

(51) Int. Cl.[7] ............................................ H01L 23/12
(52) U.S. Cl. ...................................... 257/704; 257/701
(58) Field of Search .............................. 257/704, 701, 257/710

(56) References Cited

U.S. PATENT DOCUMENTS

| | | |
|---|---|---|
| 5,397,918 A | 3/1995 | Yokochi et al. |
| 5,650,592 A | 7/1997 | Cheskis et al. |
| 5,753,857 A | 5/1998 | Choi |
| 5,773,879 A | 6/1998 | Fusayasu et al. |
| 5,804,870 A | 9/1998 | Burns |
| 5,877,546 A | 3/1999 | You |
| 6,057,597 A | 5/2000 | Farnworth et al. |
| 6,130,448 A * | 10/2000 | Bauer et al. ................. 257/222 |
| 6,204,454 B1 | 3/2001 | Gotoh et al. |
| 6,232,652 B1 | 5/2001 | Matsushima |
| 6,294,831 B1 | 9/2001 | Shishido et al. |
| 6,313,521 B1 | 11/2001 | Baba |
| 6,317,326 B1 | 11/2001 | Vogel et al. |
| 6,531,784 B1 | 3/2003 | Shim et al. |

* cited by examiner

Primary Examiner—Roy Potter
(74) Attorney, Agent, or Firm—Browdy and Neimark, PLLC

(57) ABSTRACT

An IC chip package is constructed to include a substrate, a chip, adhesive means, a cover, and a spacer. The substrate has a top side, a bottom side, and a plurality of conductive pads at the top side. The chip is fixedly mounted in the top side of the substrate, having a plurality of conductive pads respectively electrically connected to the conductive pads of substrate by respective bonding wires. The adhesive means is provided at the top side of the substrate around the border area. The spacer is connected between the substrate and the cover to keep the cover from the substrate at a distance. The spacer has at least two columns fixedly connected between the substrate and the cover.

19 Claims, 5 Drawing Sheets

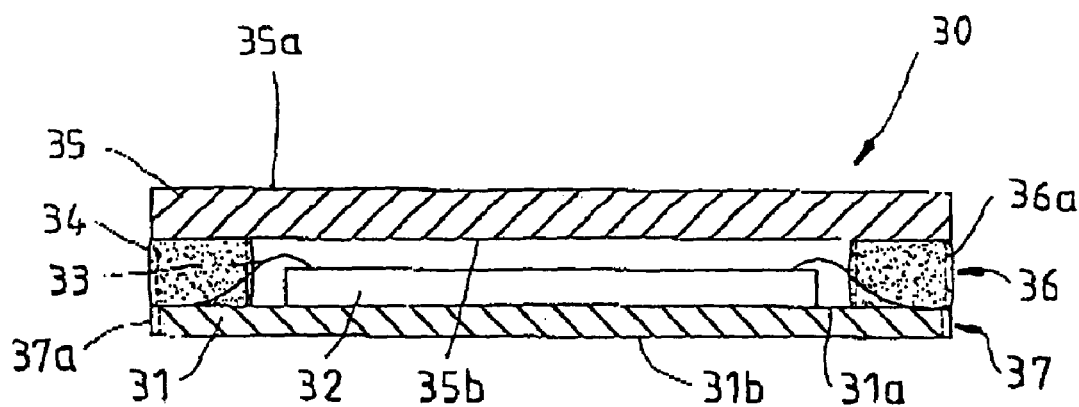
F I G. 4
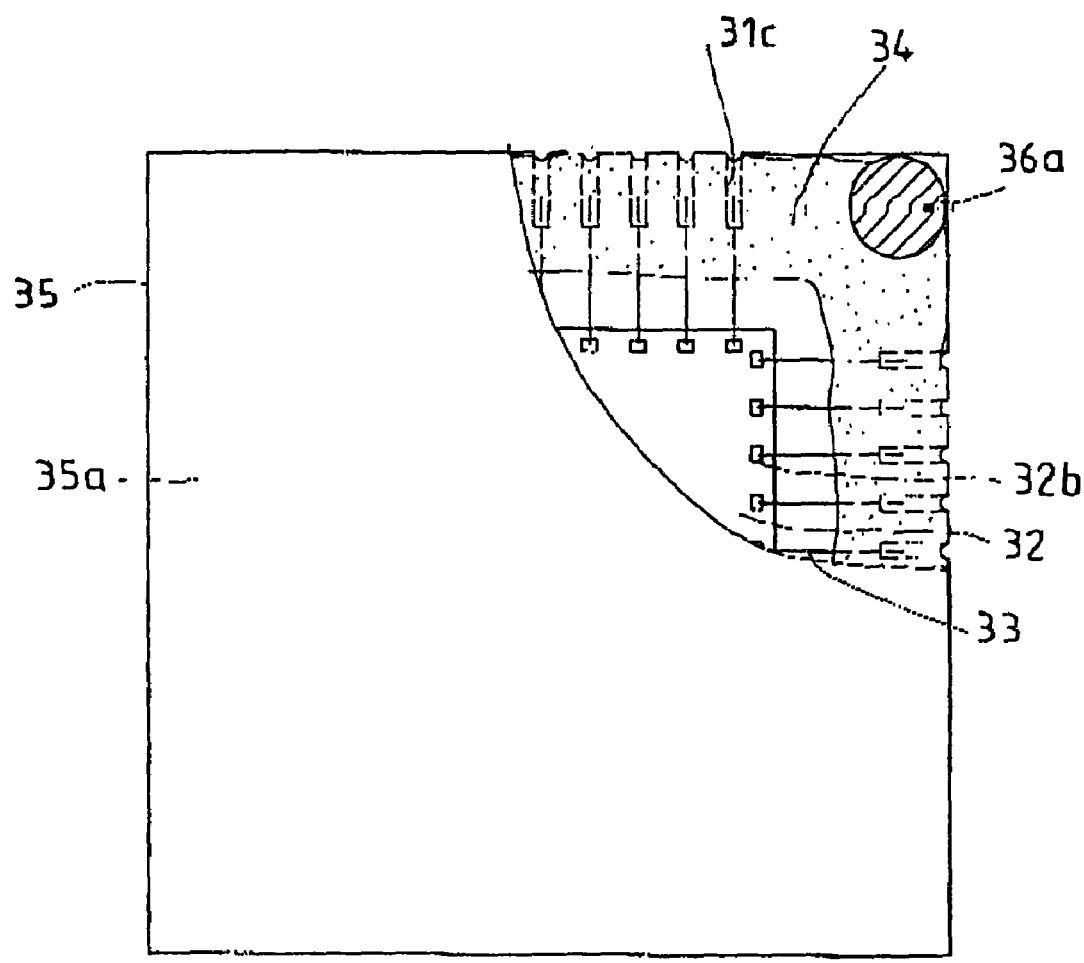
F I G. 5

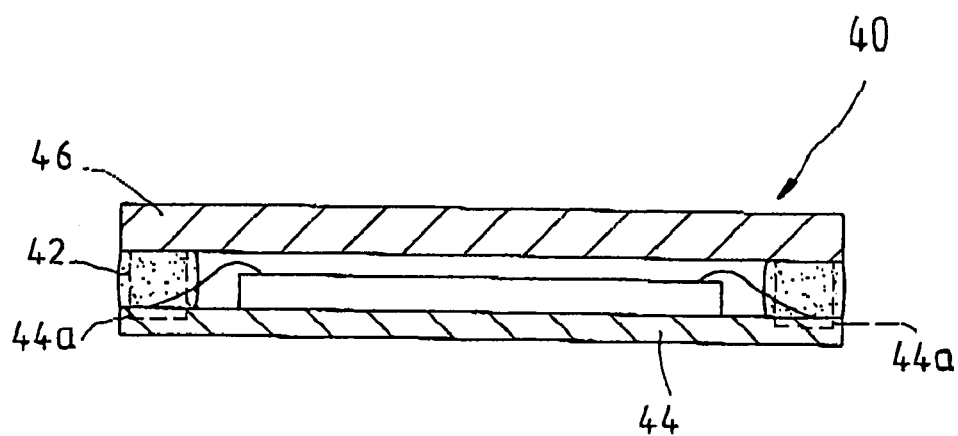
F I G. 6
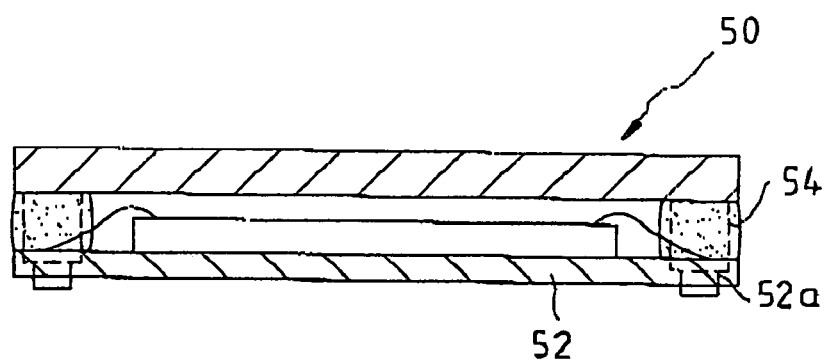
F I G. 7

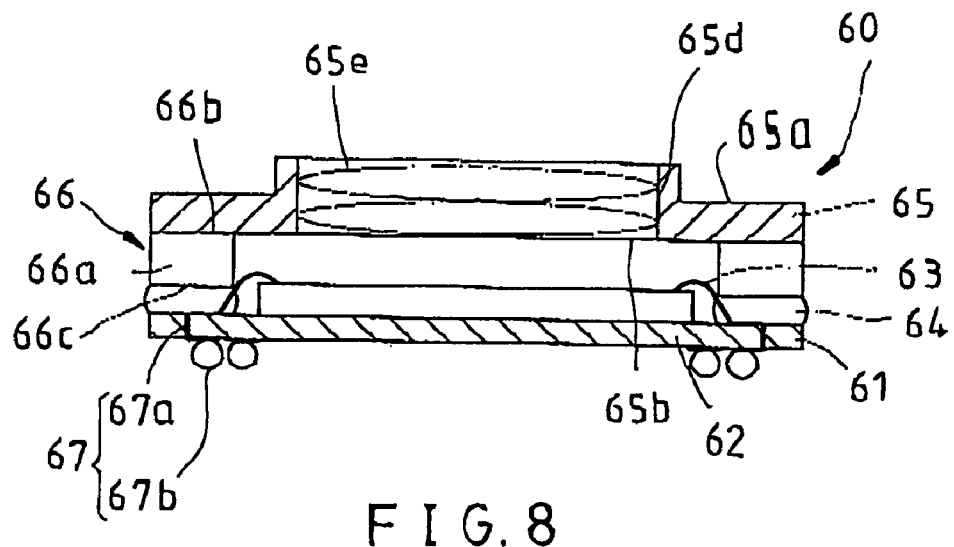
F I G. 8
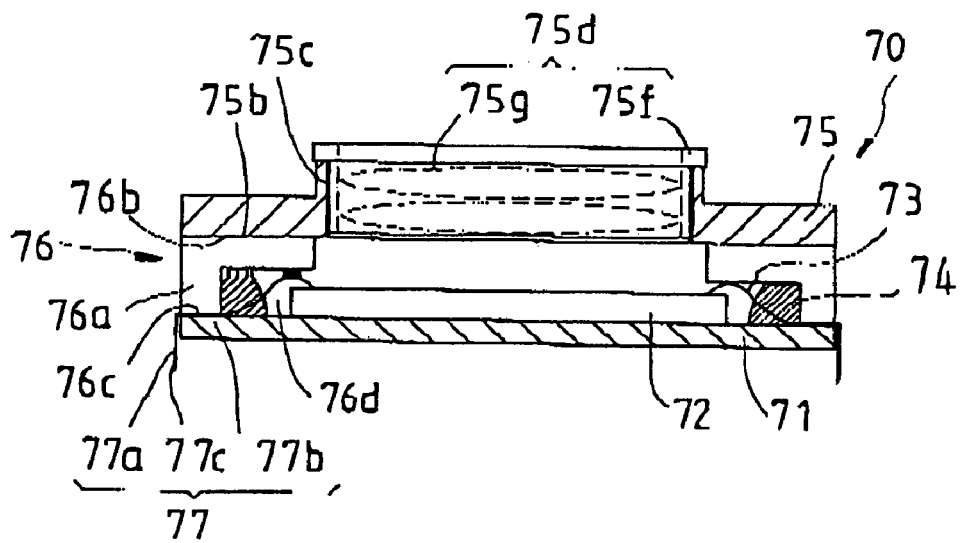
F I G. 9

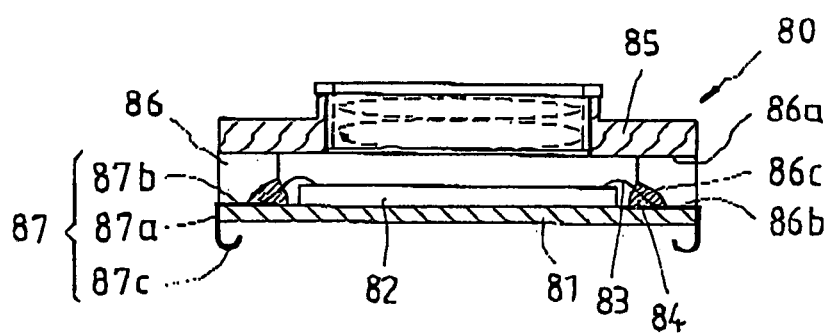
F I G. 10
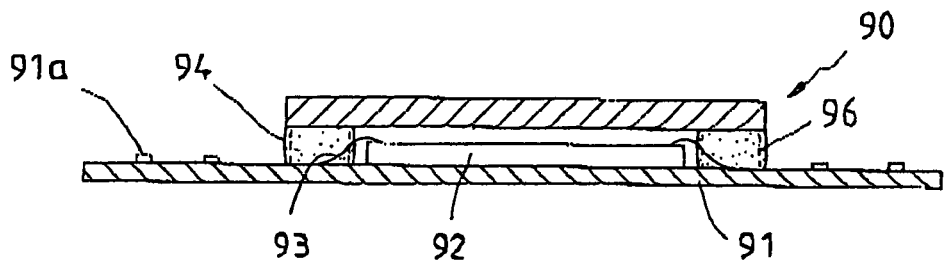
F I G. 11

IC CHIP PACKAGE

FIELD OF THE INVENTION

The present invention relates to an integrated circuit (IC) chip package and, more specifically, to a chip size package (CSP) for the IC chip.

BACKGROUND OF THE INVENTION

FIG. 1 illustrates an IC chip package according to the prior art. The package 10 comprises generally a substrate 11, a chip 12, and a cover 13. The substrate 11 has a top-open receiving chamber 14 and a certain number of conductive pads 16 arranged in predetermined pattern at the bottom of the receiving chamber 14. The chip 12 is adhered to the central portion of the bottom of the receiving chamber 14, and electrically connected to the conductive pads 16 by bonding wires 17. The cover 13 closes the open side of the substrate 11 to protect the chip 12 against external impact or pollutant. The cover 13 shall be made of transparent material in case the chip 12 is an image sensor such as charge coupled device (CCD) or complementary metal oxide semiconductor (CMOS). FIG. 2 shows another design of IC chip package 20 according to the prior art. This design is similar to the IC chip package 10 shown in FIG. 1.

In the aforesaid package 10, the bottom of the receiving chamber 14 must receive the chip 12 and the conductive pads 16 of the substrate 11, and sufficient space should be provided between the chip 12 and the wall of the receiving chamber 14 for the movement of the wire bonding tool, and therefore, the area of the bottom of the receiving chamber 14 must be greater than the chip. Due to the aforesaid reasons, this package does not meet the requirements for light, thin, small, and short electronic products.

Further, since the substrate 11 is generally made of reinforced plastic or ceramic printed circuit board, it is complicated to process the receiving chamber in the substrate.

SUMMARY OF THE INVENTION

The primary objective of the present invention is to provide an IC chip package, which achieves the requirement for small dimensions.

It is another objective of the present invention to provide a simple structure of IC chip package, which is easy and inexpensive to manufacture.

The IC chip package of the present invention comprises a substrate, a chip, bonding wires, adhesive means, a cover and a spacer. The substrate has a top side, a bottom side, and a plurality of conductive pads arranged on the top side thereof. The chip is fixedly mounted on the top side of the substrate, which comprises a plurality of conductive pads. The bonding wires are respectively electrically connected between the conductive pads of the substrate and the conductive pads of the chip. The adhesive means is provided on the top side of the substrate around the border thereof. The cover is adapted for covering the substrate. The spacer is connected between the substrate and the cover to keep the cover from the substrate at a distance

BRIEF DESCRIPTION OF THE DRAWINGS

FIG. 4 is a sectional view taken along line 4—4 in FIG. 3.

FIG. 5 is a top view of the first preferred embodiment of the present invention.

FIG. 6 is a sectional view of a second preferred embodiment of the present invention.

FIG. 7 is a sectional view of a third preferred embodiment of the present invention.

FIG. 8 is a sectional view of a fourth preferred embodiment of the present invention.

FIG. 9 is a sectional view of a fifth preferred embodiment of the present invention.

FIG. 10 is a sectional view of a sixth preferred embodiment of the present invention.

FIG. 11 is a sectional view of a seventh preferred embodiment of the present invention.

DETAILED DESCRIPTION OF THE INVENTION

Figure 1:
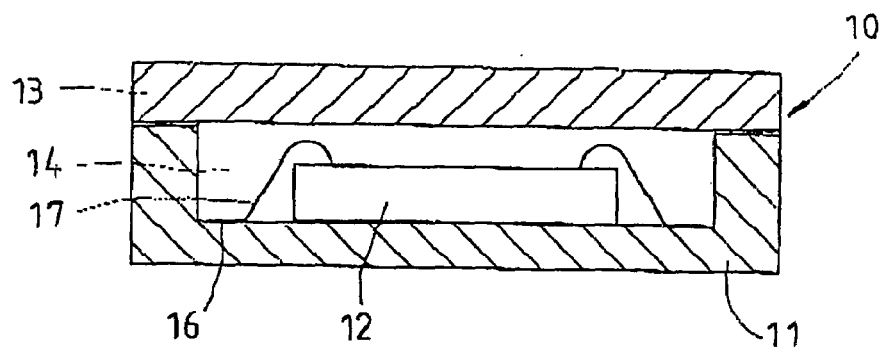
FIG. 1 is a sectional view showing an IC chip package constructed according to the prior art.
Figure 2:
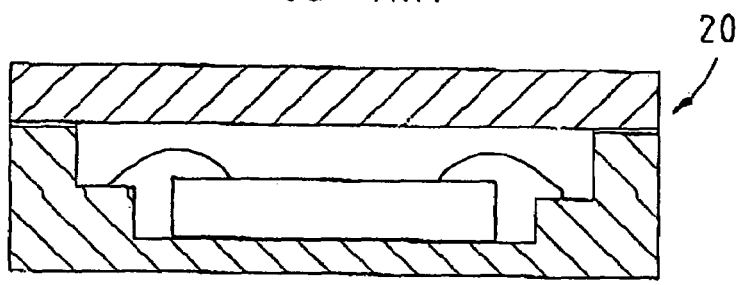
FIG. 2 is a sectional view of another IC chip package constructed according to the prior art.
Figure 3:
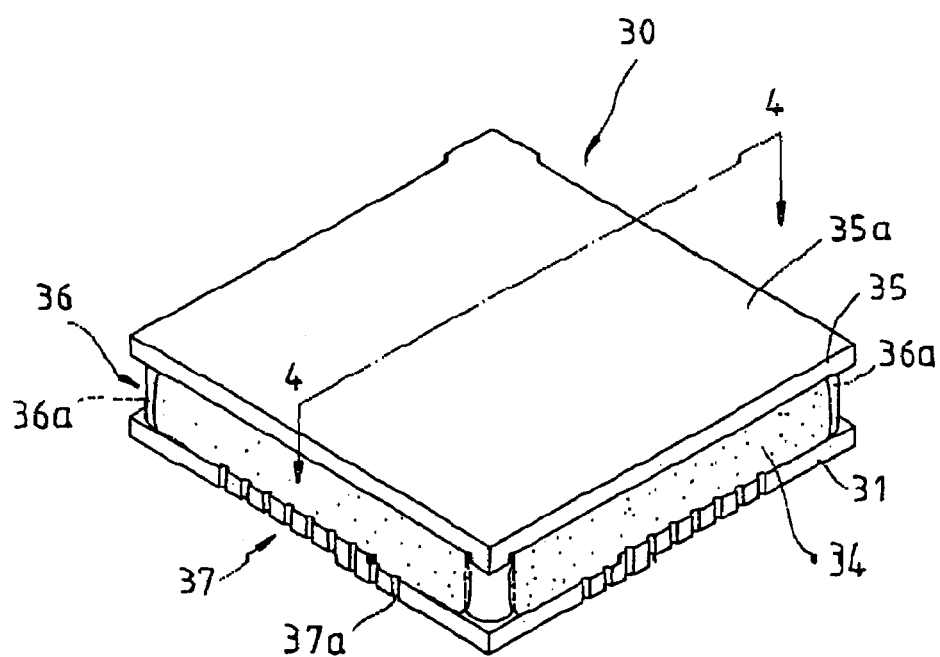
FIG. 3 is a perspective view of a first preferred embodiment of the present invention.

Referring to FIGS. from 3 through 5, an IC chip package 30 in accordance with a first preferred embodiment of the present invention is shown comprised of a substrate 31, a chip 32, bonding wires 33, adhesive means 34, a cover 35, a spacer 36, and a connecting device 37.

The substrate 31 is a PCB (printed circuit board) made of plastics, glass fibers, reinforced plastic material, ceramics, etc., having a top side 31a and a bottom side 31b. The top side 31a has conductive pads 31c thereon.

The chip 32 is fixedly fastened to the center of the top side 31a of the substrate 31. The surface of the chip 32 is provided with conductive pads 32b.

The bonding wires 33 are made of gold or aluminum alloy, each having one end respectively fastened to the conductive pads 32b of the chip 32, and an opposite end respectively connected to the conductive pads 31c of the substrate 31.

The adhesive means 34 can be obtained from silicones, epoxies, acrylics, polyamides, low melting point glass or double-sided adhesive tape. The adhesive means 34 is applied to the top side 31a of the substrate 31 and covered over the connection area between the bonding wires 33 and the conductive pads 31c of the substrate 31.

The cover 35 can be an opaque plate member made of plastics or metal, or a transparent plate member made of glass or plastics, having a top side 35a and a bottom side 35b.

The spacer 36 connects the substrate 31 and the cover 35, keeping the cover 35 spaced from the top side 31a of the substrate 31 at a distance. According to this embodiment, the spacer 36 comprises four columns 36a. The columns 36a each have one end respectively formed integral with the four corners of the bottom side 35b of the cover 35, and the other end respectively stopped at the top side 31a of the substrate 31, enabling the border of the bottom side 35b of the cover 35 to be fastened to the adhesive means 34. When installed, the cover 35, the adhesive means 34 and the spacer 36 isolate the chip 32 from the outside, and protect the chip 32 against damage of external force or contamination of external pollutant.

The connecting device 37 is adapted to electrically connect the conductive pads 31c of the substrate 31 to the outside of the substrate 31. According to this embodiment, the connecting device 37 comprises a plurality of plated through holes which are provided around the periphery of the substrate 31 to connect the conductive pads 31c at the top side 31a of the substrate 31 to the bottom side 31b of the substrate 31 for further electric connection to a circuit board (not shown).

According to the aforesaid arrangement, the periphery of the top side 31a of the substrate 31 defines an open space convenient for the operation of a wire bonding tool. Therefore, the area of the substrate 31 can be made as small as the chip 32 to minimize the dimensions of the package 30, so as to achieve the requirement for a chip size package and eliminate the drawbacks of the prior art designs.

FIG. 6 shows an IC chip package 40 constructed according to a second preferred embodiment of the present invention. This embodiment is substantially similar to the aforesaid first embodiment with the exception of the positioning of the spacer. According to this embodiment, the columns 42 each have one end fastened to a respective recessed locating hole 44a in the top side of the substrate 44 and the other end fixedly connected to the bottom side of the cover 46. Therefore, the columns 42 stably support the cover 46 on the substrate 44.

FIG. 7 shows an IC chip package 50 constructed according to a third preferred embodiment of the present invention. The main feature of this embodiment is at the design of the substrate 52. According to this embodiment, the substrate 52 has locating holes 52a extended through the top and bottom sides thereof, and the columns 54 each have one end respectively inserted through the through holes 52a to the outside of the bottom side of the substrate 52 for connection to an external circuit board (not shown).

FIG. 8 shows an IC chip package 60 constructed according to a fourth preferred embodiment of the present invention. According to this embodiment, the IC chip package 60 comprises a substrate 61, an image chip 62, bonding wires 63, adhesive means 64, a cover 65, a spacer 66, and a connecting device 67.

The cover 65 comprises a top side 65a, a bottom side 65b, a through hole 65d through the top side 65a and the bottom side 65b, and a plurality of lenses 65e respectively sealed in the through hole 65d to focus light onto the image chip 62.

The spacer 66 is comprised of an open frame 66a. The open frame 66a has a top side 66b connected to the bottom side 65b of the cover 65, and a bottom side 65c fastened to the adhesive means 64.

The connecting device 67 comprises a plurality of plated through holes 67a electrically connecting the conductive pads at the top side of the substrate 61 to the bottom side of the substrate 61, and a plurality of solder balls 67b arranged at the bottom side of the substrate 61 and respectively electrically connected to the plated through holes 67a.

FIG. 9 shows an IC chip package 70 constructed according to a fifth preferred embodiment of the present invention. According to this embodiment, the IC chip package 70 comprises a substrate 71, an image chip 72, bonding wires 73, adhesive means 74, a cover 75, a spacer 76, and a connecting device 77.

The cover 75 has a screw hole 75c through the top side 75a and bottom side 75b thereof, and a lens unit 75d installed in the screw hole 75c. The lens unit 75d comprises a barrel 75f, and lenses 75g sealed in the barrel 75f. The barrel 75f is threaded into the screw hole 75c. Because the barrel 75f is fastened to the cover 75 by a screw joint, the user can conveniently adjust the distance (focal distance) between the lens unit 75d and the image chip 72. Alternatively, the barrel 75f can be fastened to the cover 75 by any of a variety of conventional techniques instead of the screw joint.

The spacer 76 is comprised of an open frame 76a. The open frame 76a has a top side 76b connected to the bottom side 75b of the cover 75, a bottom side 76c connected to the top side of the substrate 71, and a recessed portion 76d facing the substrate 71 and adapted to receive the adhesive means 74.

The connecting device 77 comprises a plurality of metal leads 77a, each having one end 77b respectively electrically connected to the conductive pads at the top side of the substrate 71 and the other end 77c extended to the outside of the substrate 71 and bent into a predetermined shape.

FIG. 10 shows an IC chip package 80 constructed according to a sixth preferred embodiment of the present invention. According to this embodiment, the IC chip package 80 comprises a substrate 81, an image chip 82, bonding wires 83, adhesive means 84, a cover 85, a spacer 86, and a connecting device 87.

According to this embodiment, the connecting device 86 comprises metal leads 87a. Each lead 87a has a first end 87b fixedly connected to the top side of the substrate 81 around the periphery of the chip 82 and provided with a conductive pad (not shown), which is connected to one bonding wire 83, and a second end 87c extended to the outside of the substrate 81 and bent into a predetermined shape.

The spacer 86 has a bottom side 86a pressed on the first end 87b of each lead 87, and a recessed portion 86b in the bottom side 86a for receiving the adhesive means 84.

FIG. 11 shows an IC chip package 90 constructed according to a seventh preferred embodiment of the present invention. According to this embodiment, the IC chip package 90 comprises a substrate 91, an image chip 92, bonding wires 93, adhesive means 94, a cover 95, a spacer 96, and a connecting device 97.

The substrate 91 has electronic elements 91a installed in the top side. The electronic elements 91a have circuit patterns (not shown) electrically connected to respective conductive pads (not shown) at the top side of the substrate 91. Thus, the package 90 is used as a module having a special function.

What is claimed is:

1. An IC chip package comprising:
   a substrate having a top side, a bottom side, and a plurality of conductive pads arranged on the top side;
   a chip fixedly mounted on the top side of said substrate and having a plurality of conductive pads;
   a plurality of bonding wires respectively electrically connected between the conductive pads of said substrate and the conductive pads of said chip;
   adhesive means provided on the top side of said substrate around the border thereof;
   a cover adapted for covering said substrate; and
   a spacer connected between said substrate and said cover to keep said cover from said substrate at a distance, wherein said spacer comprises at least two columns respectively fixedly connected between said substrate and said cover.

2. The IC chip package as claimed in claim 1, wherein said spacer comprises
   four columns respectively fixedly connected between said substrate and said cover.

3. The IC chip package as claimed in claim 1, wherein said adhesive means is applied to the border of the top side of said substrate and covered on the connecting area between said bonding wires and the conductive pads at the top side of said substrate.

4. The IC chip package as claimed in claim 1, wherein said cover is adhered to said adhesive means.

5. The IC chip package as claimed in claim 1, wherein the top side of said substrate has at least one recessed locating hole adapted to receive said at least one column.

6. The IC chip package as claimed in claim 1, wherein said substrate comprises at least two locating through holes extended through the top and bottom sides thereof, and each of the at least two columns of said spacer is respectively inserted through a respective one of the at least two locating holes of said substrate and exposed to the outside of the bottom side of said substrate.

7. The IC chip package as claimed in claim 1, wherein said spacer is comprised of an open frame fixedly connected between said substrate and said cover.

8. The IC chip package as claimed in claim 7, wherein said open frame has a recessed portion facing said substrate for receiving said adhesive means.

9. The IC chip package as claimed in claim 1, wherein said cover is made of transparent material.

10. The IC chip package as claimed in claim 1, wherein said cover has a through hole aimed at said chip, and at least one lens respectively sealed in the through hole.

11. The IC chip package as claimed in claim 1, wherein said cover comprises a screw hole extended through the top and bottom sides thereof corresponding in location to said chip, and a lens unit mounted in said screw hole, said lens unit comprising a barrel threaded into said screw hole and at least one lens sealed in said barrel.

12. The IC chip package as claimed in claim 1, wherein said substrate is made of the materials selected from the group consisting of reinforced plastics, glass fibers, and ceramics.

13. The IC chip package as claimed in claim 1, wherein said adhesive means is selected form the group consisting of silicones, epoxies, acrylics, polyamides, and glass.

14. The IC chip package as claimed in claim 1, wherein said adhesive means is a double-sided adhesive tape.

15. The IC chip package as claimed in claim 1, wherein said substrate further comprises a plurality of electronic elements mounted on the top side thereof and electrically connected to the conductive pads at the top side of said substrate.

16. The IC chip package as claimed in claim 1 further comprising a connecting device adapted to electrically connect the conductive pads of said substrate to an external object outside said substrate.

17. The IC chip package as claimed in claim 16, wherein said connecting device comprises a plurality of plated through holes disposed in the periphery of said substrate and adapted to connect the conductive pads at the top side of said substrate to the bottom side of said substrate.

18. The IC chip package as claimed in claim 16, wherein said connecting device comprises a plurality of plated through holes electrically connected between the conductive pads at the top side of said substrate and the bottom side of said substrate, and a plurality of solder balls provided at the bottom side of said substrate and respectively electrically connected to the through holes of said connecting device.

19. The IC chip package as claimed in claim 16, wherein said connecting device comprises a plurality of metal leads, said metal leads each having one end electrically connected to the conductive pads at the top side of said substrate and an opposite end extended to the outside of said substrate and bent into a predetermined shape.

* * * * *